United States Patent [19]

Fierkens

[11] Patent Number: 5,275,546
[45] Date of Patent: Jan. 4, 1994

[54] PLASTIC ENCAPSULATION APPARATUS FOR AN INTEGRATED CIRCUIT LEAD FRAME AND METHOD THEREFOR

[76] Inventor: Richard H. J. Fierkens, Keurbeck 15, 6914 AE, Herwen, Netherlands

[21] Appl. No.: 814,505

[22] Filed: Dec. 30, 1991

[51] Int. Cl.⁵ .................. B29C 45/02; B29C 45/14; B29C 45/26
[52] U.S. Cl. .................. 425/116; 425/117; 425/544; 425/DIG. 228; 264/272.170; 249/095
[58] Field of Search .......... 264/272.17; 425/572, 425/116, 117, 544, 588, DIG.; 249/95

[56] References Cited

U.S. PATENT DOCUMENTS

| | | | |
|---|---|---|---|
| 3,278,992 | 5/1962 | Strauss | 264/328.4 |
| 4,332,537 | 6/1982 | Slepoevic | 425/572 |
| 4,513,942 | 4/1985 | Creasman | 264/272.17 |
| 4,663,833 | 5/1987 | Tanaka et al. | 264/272.17 |
| 4,712,994 | 12/1987 | Fierkens et al. | 425/572 |
| 4,915,607 | 4/1990 | Medders et al. | 264/272.17 |
| 4,946,633 | 8/1990 | Saeki et al. | 264/328.4 |
| 4,954,307 | 9/1990 | Yokoyama | 425/116 |
| 4,954,308 | 9/1990 | Yabe et al. | 264/272.17 |
| 5,082,615 | 1/1992 | Sakai | 264/272.17 |

FOREIGN PATENT DOCUMENTS

| | | | |
|---|---|---|---|
| 52-43366 | 4/1977 | Japan | 264/272.17 |
| 59-201429 | 11/1984 | Japan | 264/272.17 |
| 60-251635 | 12/1985 | Japan | 264/328.4 |
| 62-128721 | 6/1987 | Japan | 264/272.17 |
| 63-7638 | 1/1988 | Japan | 264/272.17 |
| 2-9142 | 1/1990 | Japan | 264/272.17 |
| 2-186647 | 7/1990 | Japan | 264/272.17 |
| 3-94432 | 4/1991 | Japan | 264/272.17 |

Primary Examiner—Khanh P. Nguyen
Attorney, Agent, or Firm—Harry M. Weiss

[57] ABSTRACT

An apparatus for encapsulating an integrated circuit lead frame in plastic is disclosed. This apparatus includes an upper mold and a lower mold which, when properly joined together, define the package area of the lead frame as well as a reservoir for the molten plastic and a conduit and flow pocket for assuring uniform flow of plastic into the package area of the molds. The integrated circuit lead frame has a flow hole to allow the molten plastic to flow from the conduit into the flow pocket and into the bottom portion of the package area. The conduit also allows the molten plastic to flow directly to the top portion of the package area. With the plastic being more uniformly injected into both (top and bottom) package or cavity areas at once, the likelihood of air pockets, and to overcome wiresweep cavities and other imperfections in the final plastic package is reduced.

2 Claims, 1 Drawing Sheet

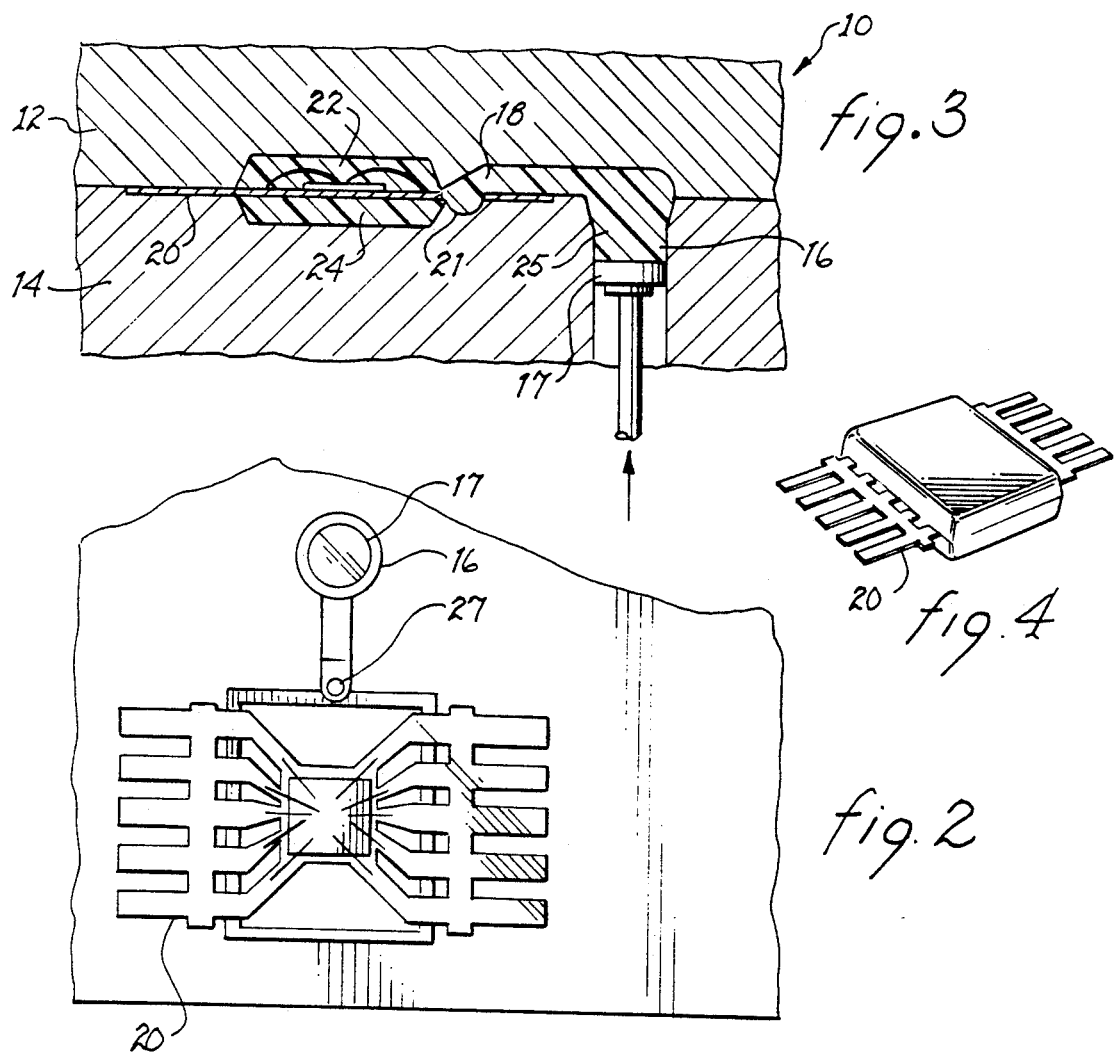
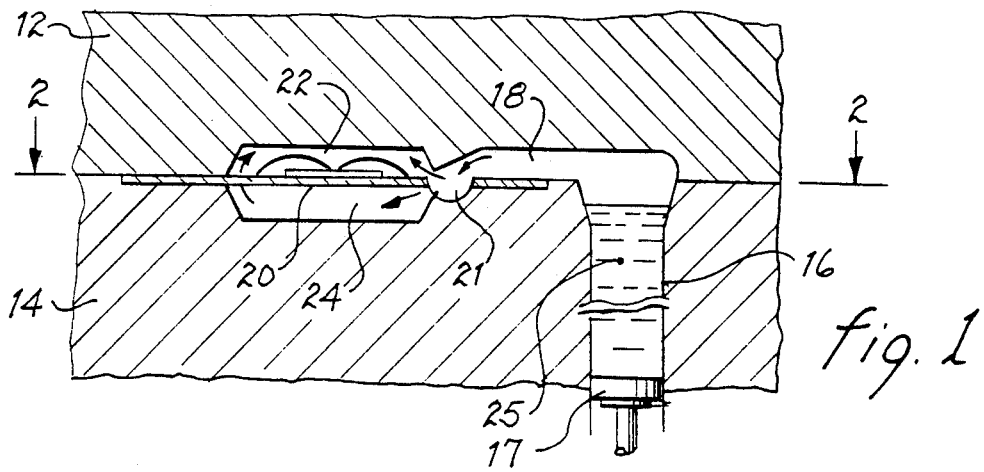

PLASTIC ENCAPSULATION APPARATUS FOR AN INTEGRATED CIRCUIT LEAD FRAME AND METHOD THEREFOR

FIELD OF THE INVENTION

This invention generally relates to semiconductor packaging apparatus and methods, and more specifically relates to an improved plastic encapsulation apparatus for an integrated circuit lead frame and method therefor which is used to encapsulate the integrated circuit mounted on a lead frame with molten plastic to form a typical plastic integrated circuit package commonly in use in the industry.

DESCRIPTION OF THE PRIOR ART

The prior art apparatus and method for encapsulating an integrated circuit lead frame to form a typical plastic package used a top and bottom mold, the top mold defining a cavity for the integrated circuit package and the bottom mold having shallow impressions wherein a lead frame is placed, and having a cavity for the integrated circuit package. An integrated circuit mounted on a lead frame was placed in the impression in the bottom mold, and the top and bottom molds are joined together such that the lead frame is in the approximate center of the cavity defined by the two molds. A reservoir that held molten plastic had a conduit which provided a path for the molten plastic to flow into the cavity defined by the top and bottom molds. A pressure source forced the molten plastic from the reservoir through the conduit into the top cavity and onto the top of the integrated circuit (semiconductor chip) and lead frame. The plastic flowed from the top of the lead frame to the bottom, filling the cavity defined by the top and bottom molds, thereby encapsulating the integrated circuit and appropriate adjacent portion of the lead frame. The apparatus and method of the prior art only injects plastic into the top cavity, depending on pressure to force the plastic around the integrated circuit and the lead frame into the bottom cavity portion. This method can cause air pockets and cavities to be formed in the plastic material located under the lead frame. Also, more pressure is needed in creating plastic flow from the top cavity portion to the bottom cavity portion.

Therefore, there existed a need to provide an improved plastic encapsulation apparatus for an integrated circuit lead frame which provides a more uniform flow of plastic around the lead frame, thereby reducing the likelihood of air pockets, cavities, undesired pressure, and other imperfections in the finished plastic package.

SUMMARY OF THE INVENTION

It is an object of this invention to provide an improved plastic encapsulation apparatus for an integrated circuit lead frame and method therefor that provides for a more uniform flow of plastic around the lead frame, thereby reducing the likelihood of imperfections in the final plastic package.

According to the present invention, an integrated circuit with lead frame is provided. This lead frame is placed into the appropriate impressions in a lower mold, and an upper mold is then secured into place above the lead frame and lower mold. The two molds in combination define a cavity, the size of the final plastic package, and also provide a conduit from a reservoir of fluid plastic to the cavity. The lead frame has one or more holes in the leads thereof to allow the plastic to flow more uniformly to the cavity (top and bottom) portions located on both sides of the lead frame. A pressure source forces the plastic from the reservoir through a conduit into both the upper and lower portions of the cavity surrounding the lead frame. A specially configured recess in the lower mold, in conjunction and cooperation with a hole in the lead frame, assures more uniform flow of the plastic on both sides of the lead frame, reducing the pressure of the plastic flow and decreasing the likelihood of air pockets, cavities, or other imperfections in the final plastic package.

The foregoing and other objects, features and advantages will be apparent from the following description of the preferred embodiment of the invention as illustrated in the accompanying drawings.

BRIEF DESCRIPTION OF THE DRAWINGS

FIG. 1 is a cross-sectional view of the apparatus of the present invention showing the upper mold, lower mold, plastic reservoir, conduit, and lead frame to be packaged with plastic encapsulating material.

FIG. 2 is a top view of the apparatus shown in FIG. 1 taken along line 2—2 showing the lower mold, plastic reservoir, and lead frame to be packaged.

FIG. 3 is a cross-sectional view of the apparatus of FIG. 1 after the plastic in the plastic reservoir has been forced into the cavity around the lead frame.

FIG. 4 is a perspective view of the integrated circuit lead frame with its plastic package after processing with the apparatus of the present invention.

DESCRIPTION OF THE PREFERRED EMBODIMENT

The apparatus of the present invention provides an improved method for encapsulating integrated circuit lead frames in plastic in such a manner as to reduce the likelihood of air pockets, cavities, and other imperfections in the final plastic package.

The operation of the apparatus of the present invention can be best understood by referring to the figures. As shown in FIG. 1, this apparatus 10 comprises an upper mold 12 with upper package cavity 22, a lower mold 14 with lower package cavity 24, a plastic reservoir 16 within lower mold 14, a pressure source 17, a semicircular flow pocket 21 within lower mold 14, a conduit 18 within upper mold 12, and a lead frame 20 to be processed.

The lead frame 20 to be processed is placed as shown in FIG. 2 within impressions in lower mold 14 (see FIGS. 1 or 3) that correspond precisely with the shape of the lead frame 20 to be processed, which impressions are substantially the same depth as the thickness of the lead frame 20 to be processed. Lead frame 20 to be processed has a hole 27 as shown which allows the molten plastic to flow from the conduit 18 to the flow pocket 21 (see FIGS. 1 and 3). Once the lead frame 20 to be processed is correctly in place in the lower mold 14 (see FIGS. 1 and 3), the upper mold 12 is secured into the proper position on top of lower mold 14, as shown in FIG. 1. The molten plastic 25 in reservoir 16 is then pushed by way of the pressure source 17 through conduit 18 and flow pocket 21, into upper package cavity 22 and lower package cavity 24. As shown by the arrows in FIG. 1, the hole 27 in the lead frame 20 to be processed and the flow pocket 21 allow the plastic 25 to flow simultaneously on both the top and bottom sides of the lead frame 20 to be processed. This more uniform flow requires less pressure to achieve encapsulation and also reduces the likelihood of air pockets, cavities, and other defects such as wiresweep in the final plastic package. The flow of plastic continues until both the upper package cavity 22 and the lower package cavity 24 are completely full, as shown in FIG. 3. Once the plastic cools, the lead frame with its new plastic package are removed from the molds, and appear as shown in FIG. 4, ready for subsequent processing.

For illustrative purposes, an integrated circuit lead frame with leads on two sides is shown in the figures. Note that this specific example is for illustration only, and many different types of integrated circuit packages and configurations could be used in conjunction with the apparatus of the present invention. The upper and lower molds of the present invention are preferably of metal construction, such as stainless steel, but may be made from other materials without departing from the scope of this invention.

While the invention has been described in its preferred embodiment, it is to be understood that the words which have been used are words of description rather than limitation, and that changes may be made within the purview of the appended claims without departing from the true scope and spirit of the invention in its broader aspects. For example, the apparatus of the present invention could have the conduit 18 defined by the lower mold 14, with the flow pocket 21 defined by the upper mold 12.

I claim:

1. An improved plastic encapsulation apparatus for an integrated circuit lead frame comprising, in combination:

an integrated circuit lead frame comprising, in combination:

a lead frame comprising a base portion having metal leads that extend from said base portion, said lead frame having at least one flow hole for allowing the passage of molten plastic therethrough; and a semiconductor chip fixedly attached to said base portion of said lead frame and having bonding wires connecting portions of said semiconductor chip to said metal leads of said lead frame;

a plastic package mold assembly comprising a lower mold having recesses therein defining a plastic reservoir, a semicircular cavity flow pocket, a lower package cavity, and shallow impressions wherein said integrated circuit lead frame is placed, and an upper mold having recesses defining a conduit and an upper package cavity, said upper mold having a slanted portion directed toward a top surface of said lead frame and is placed over said lower mold, said plastic reservoir is connected to said conduit which connects to said flow pocket, said conduit connecting to said upper cavity, said semicircular cavity flow pocket located in said lower mold and adjacent to a perimeter portion of said lower package cavity is connected to both said lower and upper package cavities, and said flow pocket connecting to said lower package cavity and said upper package cavity such that plastic in said plastic reservoir having a path of travel through said conduit and said flow pocket and then simultaneously into both said upper package cavity and said lower package cavity; and pressure means for forcing said plastic in said plastic reservoir through said conduit through said flow hole in said lead frame and through said flow pocket into said lower and upper package cavities.

2. The apparatus of claim 1 wherein said pressure means is a piston type plunger.

* * * * *